US012787274B2

(12) United States Patent
Ni et al.

(10) Patent No.: US 12,787,274 B2
(45) Date of Patent: Nov. 3, 2026

(54) FLASH MEMORY DEVICE AND METHOD FOR MANUFACTURING THE SAME

(71) Applicant: Winbond Electronics Corp., Taichung (TW)

(72) Inventors: Chih-Jung Ni, Taichung City (TW); Min-Liang Cheng, Taichung City (TW)

(73) Assignee: Winbond Electronics Corp., Taichung City (TW)

( * ) Notice: Subject to any disclaimer, the term of this patent is extended or adjusted under 35 U.S.C. 154(b) by 568 days.

(21) Appl. No.: 18/323,894

(22) Filed: May 25, 2023

(65) Prior Publication Data

US 2023/0413546 A1 Dec. 21, 2023

(30) Foreign Application Priority Data

Jun. 16, 2022 (TW) .................................. 111122370

(51) Int. Cl.
*H10B 41/30* (2023.01)
*H10D 30/68* (2025.01)
*H10D 64/01* (2025.01)

(52) U.S. Cl.
CPC ......... *H10B 41/30* (2023.02); *H10D 30/6891* (2025.01); *H10D 64/035* (2025.01)

(58) Field of Classification Search
None
See application file for complete search history.

(56) References Cited

U.S. PATENT DOCUMENTS 7,410,869 B2 8/2008 Leam et al.
7,579,237 B2 8/2009 Lee et al.
2016/0020093 A1* 1/2016 Van Aerde ........ H01L 21/02667 438/486
2019/0371914 A1* 12/2019 Yu ........................... C23C 16/56
2022/0181339 A1* 6/2022 Wu ...................... H10D 64/035

FOREIGN PATENT DOCUMENTS

| | | | |
|---|---|---|---|
| CN | 103219289 | A | 7/2013 |
| KR | 1020060122139 | A | 11/2006 |
| TW | 480715 | B | 3/2002 |
| TW | 200913168 | A | 3/2009 |
| TW | 200913169 | A | 3/2009 |
| TW | I463551 | | 12/2014 |

* cited by examiner

*Primary Examiner* — Xiaoming Liu

(74) *Attorney, Agent, or Firm* — MUNCY, GEISSLER, OLDS & LOWE, P.C.

(57) ABSTRACT

A method for manufacturing a flash memory device is provided. The method includes forming a plurality of isolation structures in a substrate, an opening is formed between two adjacent isolation structures, and conformally depositing a first silicon seed layer on the substrate and the isolation structures and performing a first cycle. The first cycle includes performing a first deposition process to conformally form a first amorphous silicon layer on the first silicon seed layer. A first recess is defined by the first amorphous silicon layer. A first in-situ chlorine etching process is performed to widen the caliber of the first recess. The method includes performing a first thermal annealing process to transform the first amorphous silicon layer into a first polysilicon layer. The method includes performing an amorphous silicon deposition process to form an amorphous silicon layer on the first polysilicon layer and completely fill the opening.

15 Claims, 7 Drawing Sheets

FLASH MEMORY DEVICE AND METHOD FOR MANUFACTURING THE SAME

CROSS REFERENCE TO RELATED APPLICATIONS

This application claims priority of Taiwan Patent Application No. 111122370 filed on Jun. 16, 2022, the entirety of which is incorporated by reference herein.

BACKGROUND

Technical Field

The present disclosure relates to a memory device, and in particular to a flash memory device and a method for manufacturing the same.

Description of the Related Art

In the current process of manufacturing flash memory, the top of the recess that is used for forming a floating gate is narrower than the bottom of the recess. As a result, the polysilicon layer (i.e., the floating gate) formed in the recess is prone to having defects such as seams and voids. These defects can reduce the performance, yield, reliability and durability of the memory device.

For example, if the seams in the polysilicon layer are exposed in a chemical mechanical polishing (CMP) process, the subsequent inter-gate dielectric layer will seep into the seams, thereby causing increased voltage loss from the control gate to the floating gate in this region. Consequently, the operating speed of the memory device will be reduced. In addition, the inter-gate dielectric layer that fills the seams will result in a wider critical voltage distribution in the memory cell, thereby reducing the performance and reliability of the memory device. In addition, during the subsequent patterning process that forms the control gate, the seams in the floating gate may become exposed on the sidewalls. During the patterning process, the exposed seams may cause damage or thinning of the tunnel oxide layer below the floating gate, causing subsequent charges stored in the floating gate to leak through this damaged portion. As a result, the data retention capability of the memory cell is reduced, and the memory cell may even fail. Therefore, the durability and yield of the memory device will be reduced.

In order to reduce the seams formed in the floating gate, in a conventional technology (e.g., Patent No. TWI463551), the top of the isolation structure is usually etched to widen the top of the recess used in forming the floating gate. However, as the process is progressively scaled down, such a method may result in narrowing the recess used in forming the control gate, making it easier to form seams in the control gate. If the control gate contains seams, oxygen gas may enter through the seams and form a silicon oxide layer. In the subsequent patterning process, the etching process may stop at the silicon oxide layer, resulting in polysilicon residue below the oxide layer. As a result, a short circuit may occur between adjacent memory cells, leading to memory device failure and lower yield. In addition, if an oxide layer is formed in the control gate, voltage loss and parasitic capacitance may occur at the control gate and floating gate, thereby affecting the performance of the memory device.

With the scaling-down of the process, the recess used in forming the floating gate usually has a high aspect ratio, and therefore the effect of avoiding the seams using the above method becomes worse. Therefore, the problems caused by the seams mentioned above cannot be solved. Those skilled in the art urgently need to find a way to improve the performance, yield, reliability, and durability of the flash memory device.

BRIEF SUMMARY

The embodiment of the present disclosure provides a method for manufacturing a flash memory device capable of improving the performance, yield, reliability, and durability of the flash memory device.

An embodiment of the present disclosure provides a method for manufacturing a flash memory device. The method includes the following steps. A plurality of isolation structures is formed in a substrate. An opening is formed between every two adjacent isolation structures. The width at the top of the opening (the top width) is narrower than less than the width at the bottom of the opening (the bottom width). A first silicon seed layer is conformally deposited on the substrate and the isolation structures. A first cycle is performed. The first cycle includes a first deposition process to conformally form a first amorphous silicon layer on the first silicon seed layer. The first recess is defined by the first amorphous silicon layer. After the first deposition process, a first in-situ chlorine etching process is performed to widen the caliber of the first recess. A first thermal annealing process is performed to transform the first amorphous silicon layer into a first polysilicon layer. An amorphous silicon deposition process is performed to form an amorphous silicon layer on the first polysilicon layer and to completely fill the opening.

Another embodiment of the present disclosure provides a flash memory device. The flash memory device includes a plurality of isolation structures formed in a substrate. The flash memory device includes a floating gate, wherein the top width is less than the bottom width. The floating gate includes a first polysilicon layer formed on the substrate between two adjacent isolation structures. The flash memory device includes a second polysilicon layer formed on the first polysilicon layer. There is an interface between the first polysilicon layer and the second polysilicon layer. The interface has a V-shaped cross-sectional profile. The flash memory device includes a dielectric layer formed on the second polysilicon layer. The flash memory device includes control gate formed on the dielectric layer.

According to the method for manufacturing the flash memory device provided in the embodiment of the present disclosure, the shape of the amorphous silicon layer is gradually trimmed by repeating the amorphous silicon deposition and in-situ chlorine etching to reduce the number of seams. In addition, the stress between the amorphous silicon layer and the isolation structure is released by the thermal annealing process before the recess is completely filled, to avoid the formation of pits between the polysilicon layer and the isolation structure. In this way, the performance, yield, reliability, and durability of the memory device may be improved.

DETAILED DESCRIPTION

Figure 1A:
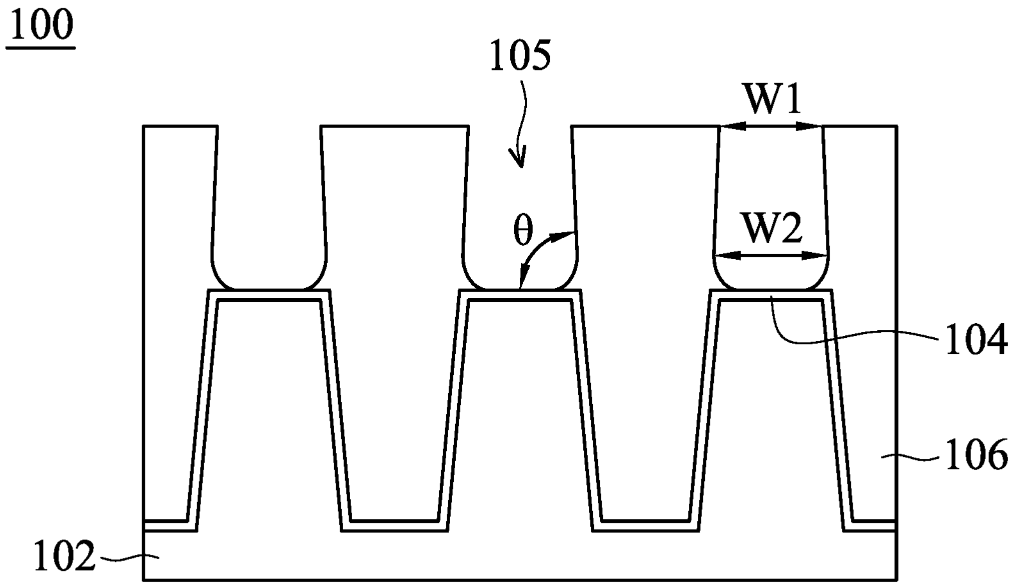
FIGS. 1A to 1K illustrate cross-sectional views at various process stages of manufacturing the flash memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−20%, +/−10% or +/−5% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art.

Referring to FIG. 1A, a method for manufacturing a flash memory device 100 includes forming a tunnel oxide layer 104 and a plurality of isolation structures 106 on a substrate 102, according to the embodiment of the present disclosure. The material of the substrate 102 may include silicon, gallium arsenide, gallium nitride, germanium silicide, silicon-on-insulator (SOI), other suitable semiconductor materials, or a combination thereof. In some embodiments, other structures may be formed in the substrate 102, such as doped regions (not shown). In the present embodiment, the substrate 102 is a silicon substrate.

The tunnel oxide layer 104 and the isolation structure 106 as shown in FIG. 1A may be formed by any conventional process. For example, a thermal oxidation process may be performed to form a liner oxide layer on a surface of the substrate 102. Next, a sacrificial layer (not shown) is formed on the liner oxide layer, and the sacrificial layer, the liner oxide layer, and the substrate 102 are patterned to form a plurality of recesses in the substrate 102. The thermal oxidation process may be performed again to conformally form a sidewall oxide layer in the plurality of recesses mentioned above. Next, an insulating material is formed and filled into the recesses. Further, a planarization process (e.g., a CMP process) is performed so that the top surface of the sacrificial layer and the top surface of the insulating material are level. Next, the sacrificial layer is removed by an etching process to form a plurality of isolation structures 106 in the substrate 102, and the top portion of the isolation structures 106 protrudes from the top surface of the substrate 102. Next, a thermal oxidation process is performed to form the tunnel oxide layer 104 after removing the pad oxide layer by an etching process. Furthermore, an opening 105 located on the top surface of the substrate 102 is defined by two adjacent isolation structures 106. The top of the opening 105 is shown to have a first width of W1 and the bottom of the opening 105 has a second width of W2. The second width W2 is greater than the first width W1. In other words, the opening 105 has a cross-sectional profile in which the top width is less than the bottom width.

The isolation structures 106 may be a single-layer structure made of a single material or a multi-layer structure made of multiple different materials. The materials of the isolation structure 106 may include nitrides, oxynitrides, carbides, or other suitable insulating materials. The isolation structure 106 may be formed by, for example, a chemical vapor deposition (CVD) process, an atomic layer deposition (ALD) process, another suitable deposition process, or a combination thereof. In the present embodiment, the isolation structures 106 are double-layer structures that include spin-on coating glass and high density oxide on the spin-on coating glass.

Figure 1B:
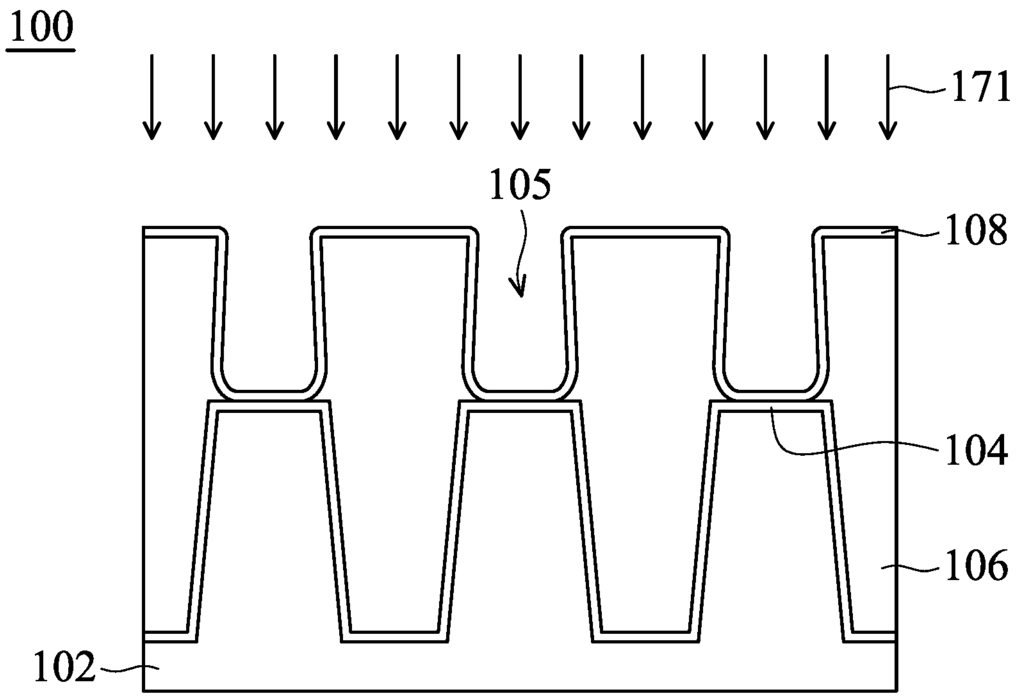

Referring to FIG. 1B, a first seed deposition process 171 is performed to conformally deposit a first silicon seed layer 108 on the substrate 102 and the isolation structures 106. In this way, the first silicon seed layer 108 may be formed to improve the surface planarity, thereby improving the surface planarity of the first amorphous silicon layer 110 subsequently formed. Suitable silicon-containing precursors may be used to form the first silicon seed layer 108. In the present embodiment, the precursors of the first silicon seed layer 108 are N,N-bis(1-methylethyl)-silanamine and disilane ($Si_2H_6$). The first seed deposition process 171 may include CVD processes, ALD processes, other suitable deposition processes, or a combination thereof. In the present embodiment, the first seed deposition process 171 is a low-pressure chemical vapor deposition (LPCVD) process.

Figure 1C:
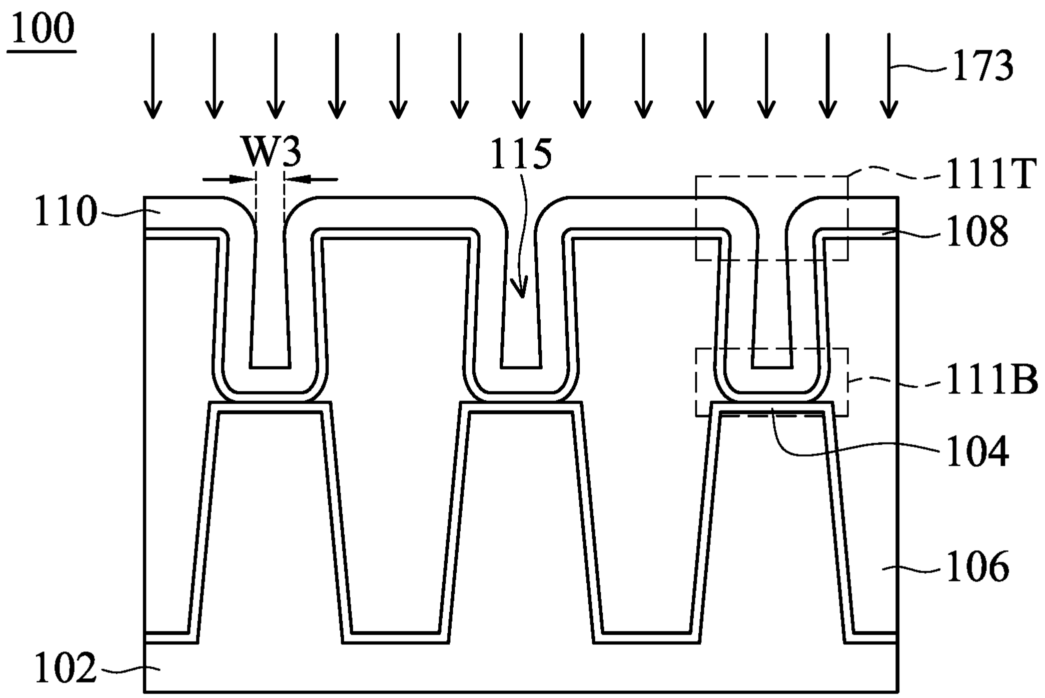
Figure 1D:
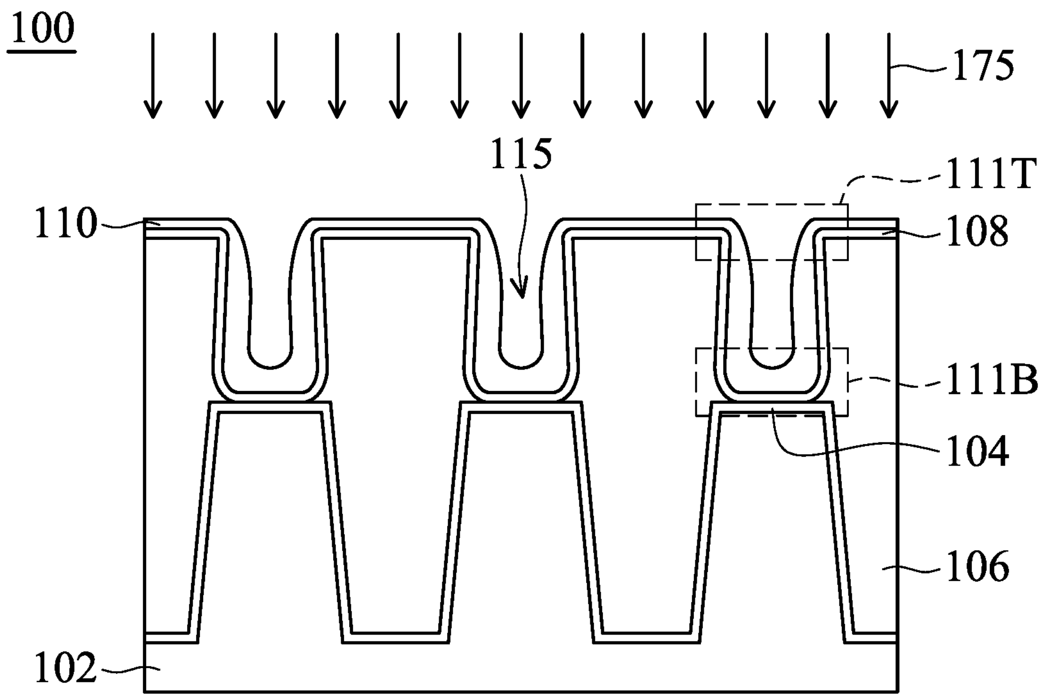

Next, referring to FIGS. 1C and 1D, a first cycle may be performed multiple times. Each iteration of this first cycle includes a first deposition process 173 and a first in-situ chlorine etching process 175. The first deposition process 173 includes conformally forming a first amorphous silicon layer 110 on a first silicon seed layer 108. A first recess 115 is defined by the surface of the first amorphous silicon layer 110. The first deposition process 173 may include a LPCVD process, an ALD process, or other suitable deposition process. In the present embodiment, the first deposition process 173 is a LPCVD process. The precursor of the first amorphous silicon layer 110 is, for example, silane ($SiH_4$). Thus, the position and profile of the first recess 115 substantially corresponds to the position and profile of the opening 105. In other words, the first recess 115 has a cross-sectional profile with the top width less than the bottom width. In the present embodiment, the first cycle can be performed in a furnace system.

After the first deposition process 173, a first in-situ chlorine etching process 175 is performed to partially remove the first amorphous silicon layer 110 and to widen the caliber of the first recess 115. Next, after the first in-situ chlorine etching process 175, a hydrogen gas is introduced to flow through the surface of the first amorphous silicon layer 110, where a flow rate of the hydrogen gas is 300-6000 sccm.

In the present embodiment, the first in-situ chlorine etching process 175 is a chemical vapor etching process using chlorine gas as the etching gas and using nitrogen gas or inert gas (e.g., helium gas, neon gas, or argon gas) as the carrier gas. In more detail, by flowing chlorine gas through the surface of the first amorphous silicon layer 110, chlorine gas reacts with the silicon on the surface of the first amorphous silicon layer 110 to produce silicon chloride ($SiCl_4$). Then, under a low-pressure environment, the reaction product (silicon chloride) leaves the surface of the first amorphous silicon layer 110 in a gaseous state. In this way, the thickness of the first amorphous silicon layer 110 is reduced (i.e., the first amorphous silicon layer 110 is etched). Compared with using fluorine gas as the etching gas in the first cycle, the first in-situ chlorine etching process 175 may make it easier to control the cross-sectional profile and the amount of the first amorphous silicon layer 110 that is etched, and it may improve the surface planarity of the etched first amorphous silicon layer 110, which is beneficial to reducing the number of seams.

Furthermore, a dry etching process using fluorine gas as the etching gas to partially remove the first amorphous silicon layer 110 only can process a single wafer at a time, compared with dry etching process, performing the first in-situ chlorine etching process 175 in the furnace system according to the present disclosure can process multiple wafers simultaneously (for example, process a hundred of wafers simultaneously). Therefore, the present embodiment can reduce the consumption of etching gas per wafer. Besides, adopting a dry etching process using fluorine gas as the etching gas to partially remove the first amorphous silicon layer 110 needs to transfer the wafer from a deposition equipment (ex. a furnace system) to a dry etching equipment, compared with dry etching process, performing the first in-situ chlorine etching process 175 in the furnace system according to the present disclosure can perform the first cycle in the same furnace system, thereby reducing the process steps, saving the cost and reducing the energy consumption of manufacturing a single IC. According, the present disclosure becomes more environmentally friendly.

The first in-situ chlorine etching process 175 is an isotropic etching process, and the etching rate depends on the concentration of chlorine. The top region 111T of the first recess 115 is closer to the chlorine source than the bottom region 111B of the first recess 115. In other words, the chlorine concentration at the top region 111T of the first recess 115 is higher than the chlorine concentration at the bottom region 111B of the first recess 115. Therefore, in the first in-situ chlorine etching process 175, the etching amount of the first amorphous silicon layer 110 at the top region 111T of the first recess 115 is greater than the etching amount of the first amorphous silicon layer 110 at the bottom region 111B of the first recess 115. In this way, the first recess 115 at the top region 111T is widened to a greater extent than the first recess 115 at the bottom region 111B. As shown in FIG. 1D, after the first in-situ chlorine etching process 175, the width of the first recess 115 at the top region 111T becomes the same as or similar to the width of the first recess 115 at the bottom region 111B.

Figure 1E:
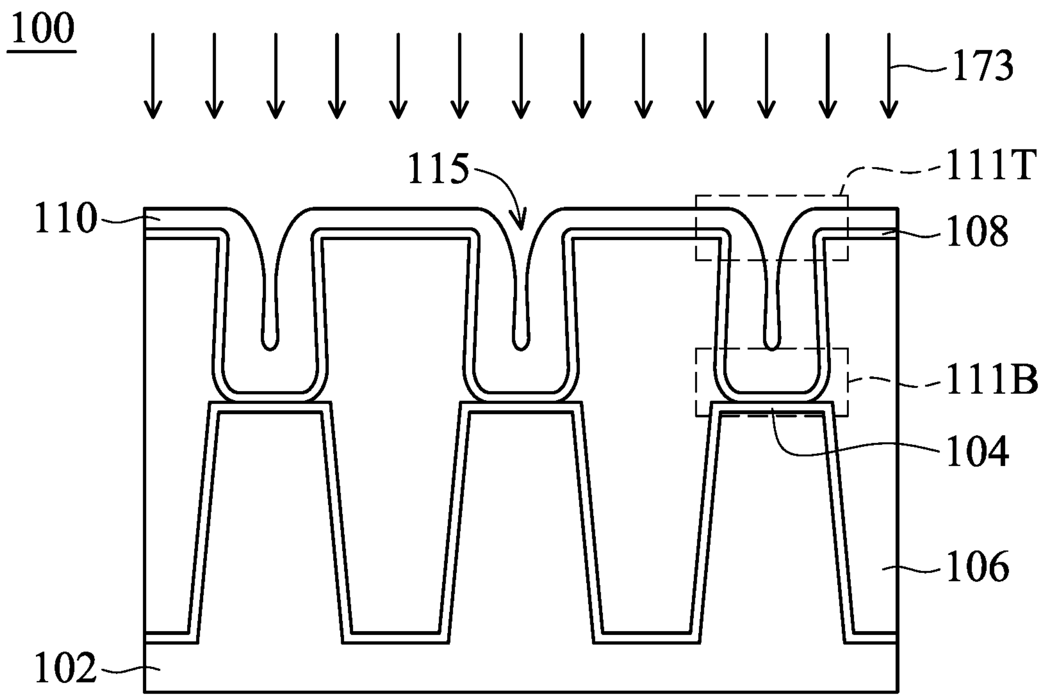

Referring to FIG. 1E, the first deposition process 173 is performed again to increase the thickness of the first amorphous silicon layer 110. After the first deposition process 173, the difference between the width of the first recess 115 at the top region 111T and the width of the first recess 115 at the bottom region 111B may increase due to the characteristics of the deposition process. For example, during the first deposition process 173, the first amorphous silicon layer 110 may form a hanging portion at the top region 111T, which further causes a reduction in the width of the first recess 115 at the top region 111T.

Figure 1F:
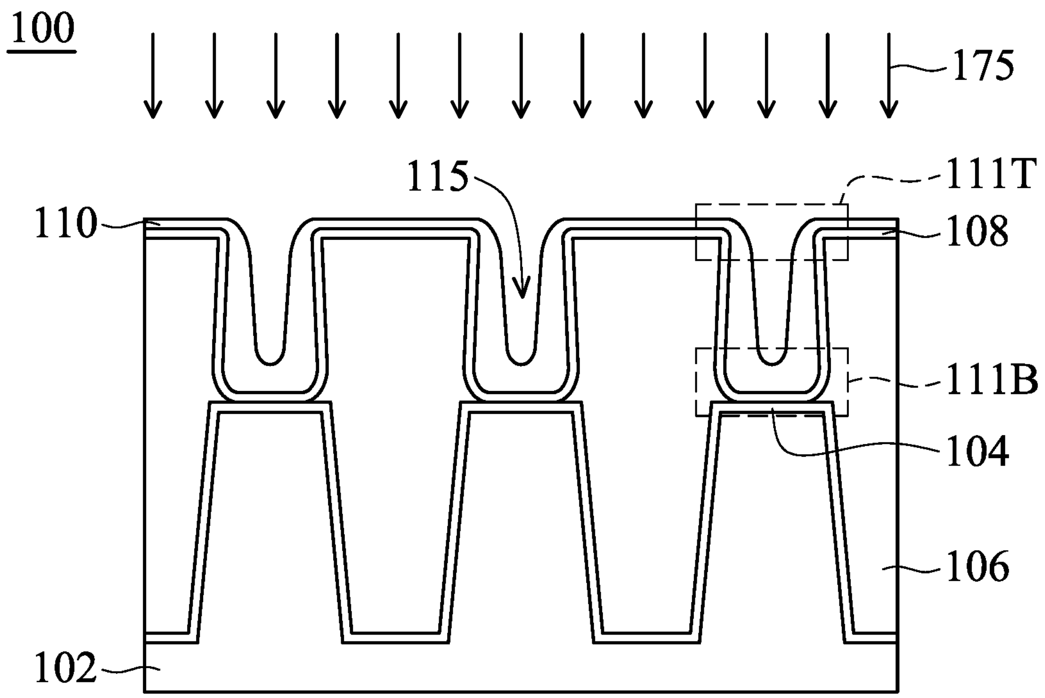

Referring to FIG. 1F, after the first deposition process 173, the first in-situ chlorine etching process 175 is performed again to partially remove the first amorphous silicon layer 110 and to widen the caliber of the first recess 115. Then, after the first in-situ chlorine etching process 175, a hydrogen gas is introduced to flow through the surface of the first amorphous layer 110, where the flow rate of the hydrogen gas is 300-6000 sccm. After the second time of the first in-situ chlorine etching process 175, the width of the first recess 115 at the top region 111T is greater than the width of the first recess 115 at the bottom region 111B.

Figure 1G:
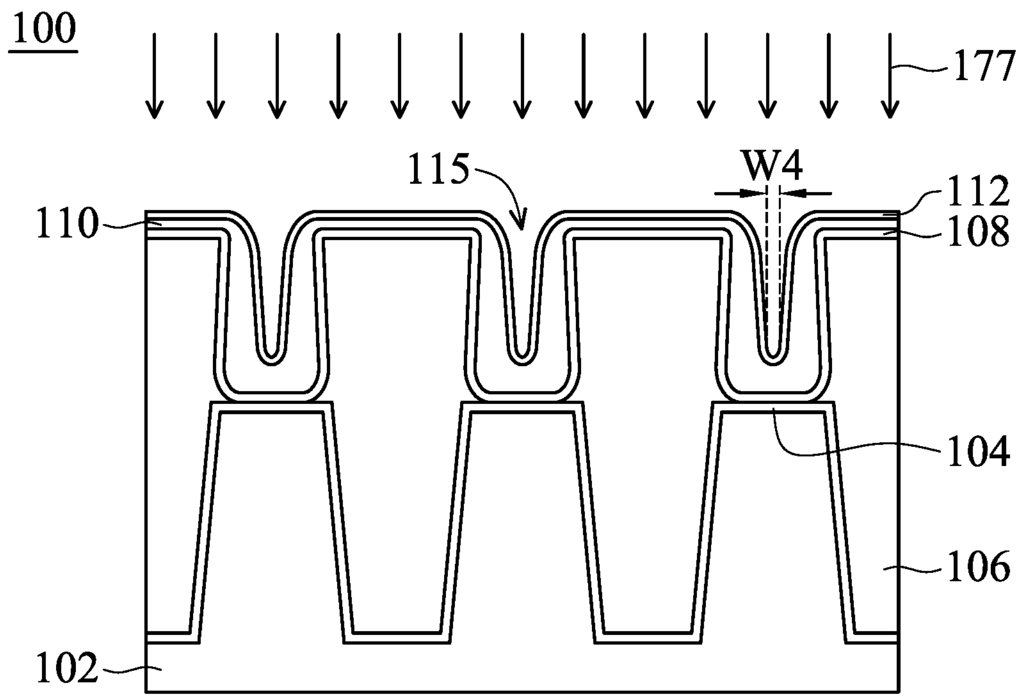

Referring to FIG. 1G, a cap deposition process 177 is performed to conformally form a cap layer 112 on the first amorphous silicon layer 110. In some embodiments, the cap layer deposition process 177 may be the same as or similar to the first seed deposition process 171, and the precursors for forming the cap layer 112 may be the same as or similar to the precursors for forming the first silicon seed layer 108. In the present embodiment, the precursors of the cap layer 112 are N,N-bis(1-methylethyl)-silanamine, disilane, and silane.

Figure 1H:
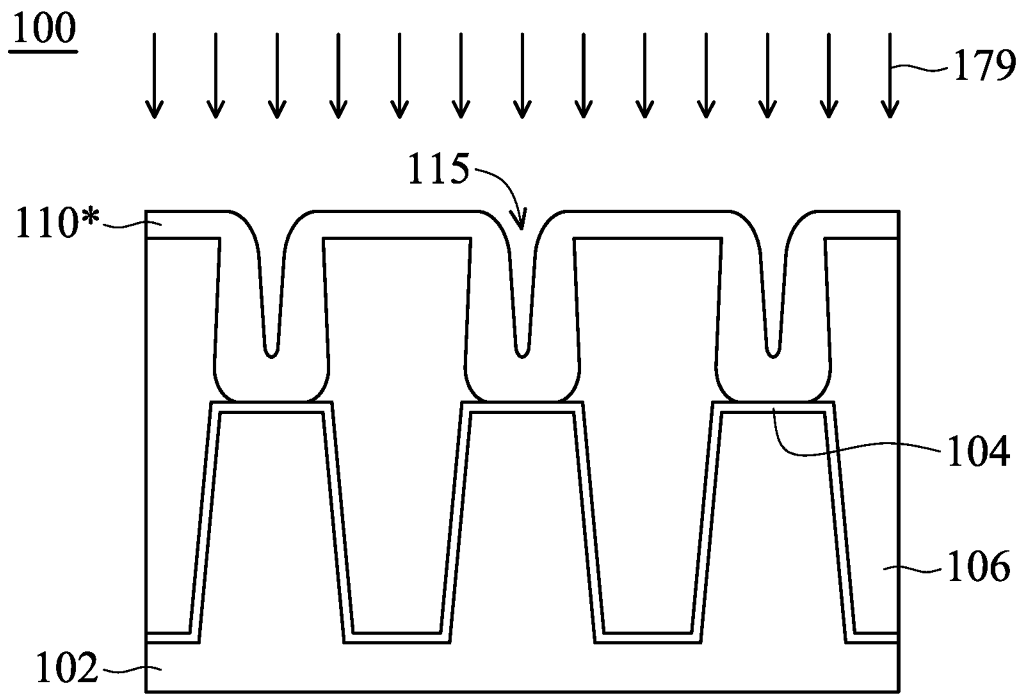

Referring to FIG. 1H, a first thermal annealing process 179 is performed to transform the first silicon seed layer 108, the first amorphous silicon layer 110, and the cap layer 112 into the first polysilicon layer 110*. In some embodiments, the first thermal annealing process 179 is a rapid thermal annealing process heat treatment and is performed at a temperature between 700° C. and 1000° C. After the first thermal annealing process 179, a native oxide layer (not shown) may form on the surface of the first polysilicon layer 110*, resulting in an increase in the resistance of the first polysilicon layer 110*, short circuiting between memory cells, and causing voltage loss and parasitic capacitance problems. In order to improve the yield and performance of the memory device, after the first thermal annealing process 179, an acid etching process may be performed to completely remove the native oxide layer. In the present embodiment, the acid etching process uses dilute hydrofluoric acid as the etching solution.

Figure 1I:
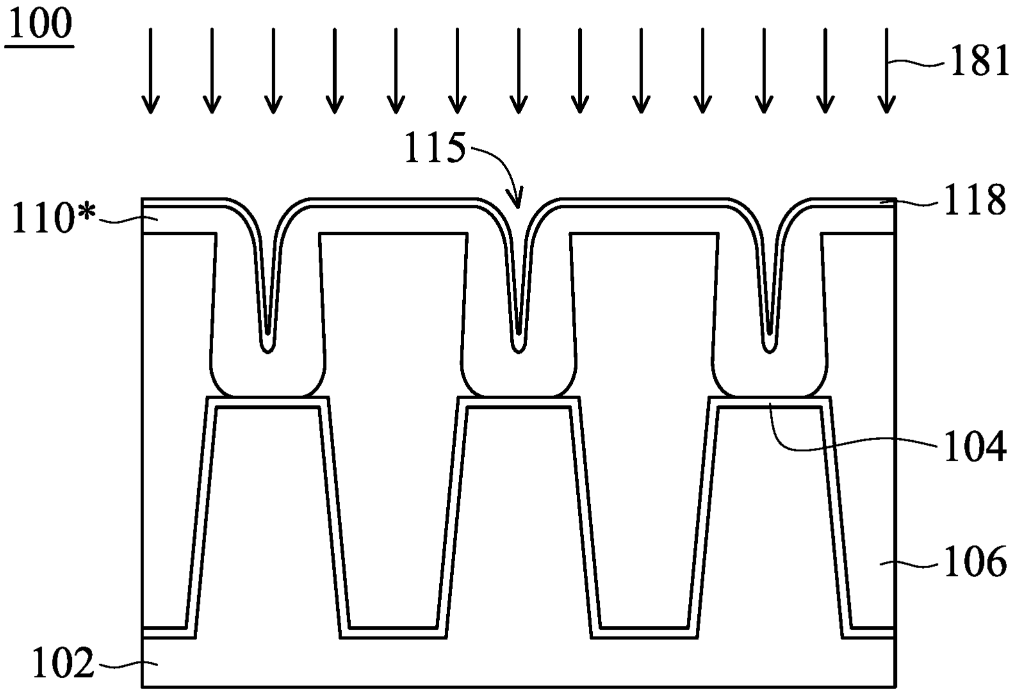

Referring to FIG. 1I, after the acid etching process, a second seed deposition process 181 is performed to conformally deposit a second silicon seed layer 118 on the first polysilicon layer 110*. The functions and precursors of the second silicon seed layer 118 may be the same as or similar to the functions and precursors of the first silicon seed layer 108, and the second seed deposition process 181 may be the same as or similar to the first seed deposition process 171. Since the grain size of polysilicon is larger than the grain size of amorphous silicon, the surface roughness of the first polysilicon layer 110* becomes greater after the first thermal annealing process 179. In the present embodiment, the planarity of the surface of the first polysilicon layer 110* may be improved by depositing a second silicon seed layer 118. As a result, the number of seams formed in the subsequent second polysilicon layer 120* may be reduced.

Figure 1J:
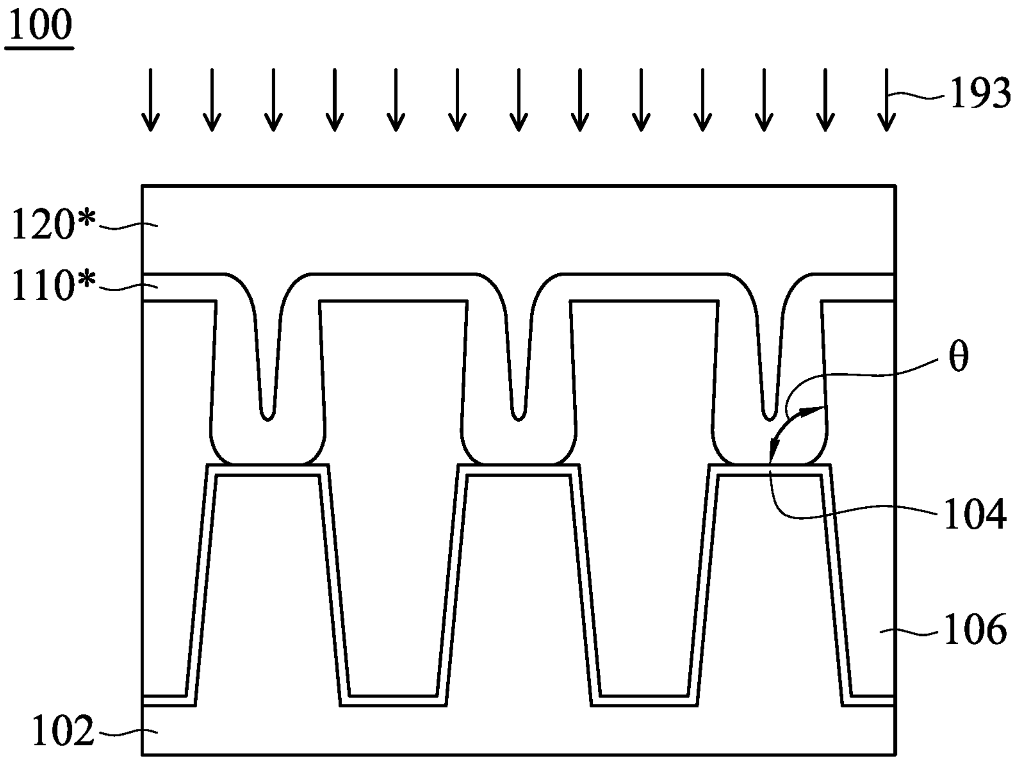

Referring to FIG. 1J, an amorphous silicon deposition process 193 is performed to form an amorphous silicon layer on the first polysilicon layer 110 and to completely fill the recess defined by the surface of the first polysilicon layer 110*. Next, a second thermal annealing process is performed to transform the amorphous silicon layer into a second polysilicon layer 120*. The precursors of the amorphous silicon layer may be the same as or similar to the precursors of the first amorphous silicon layer 110. The amorphous silicon deposition process 193 may be the same as or similar to the first deposition process 173, and the second thermal annealing process may be the same as or similar to the first thermal annealing process 179.

Figure 1K:
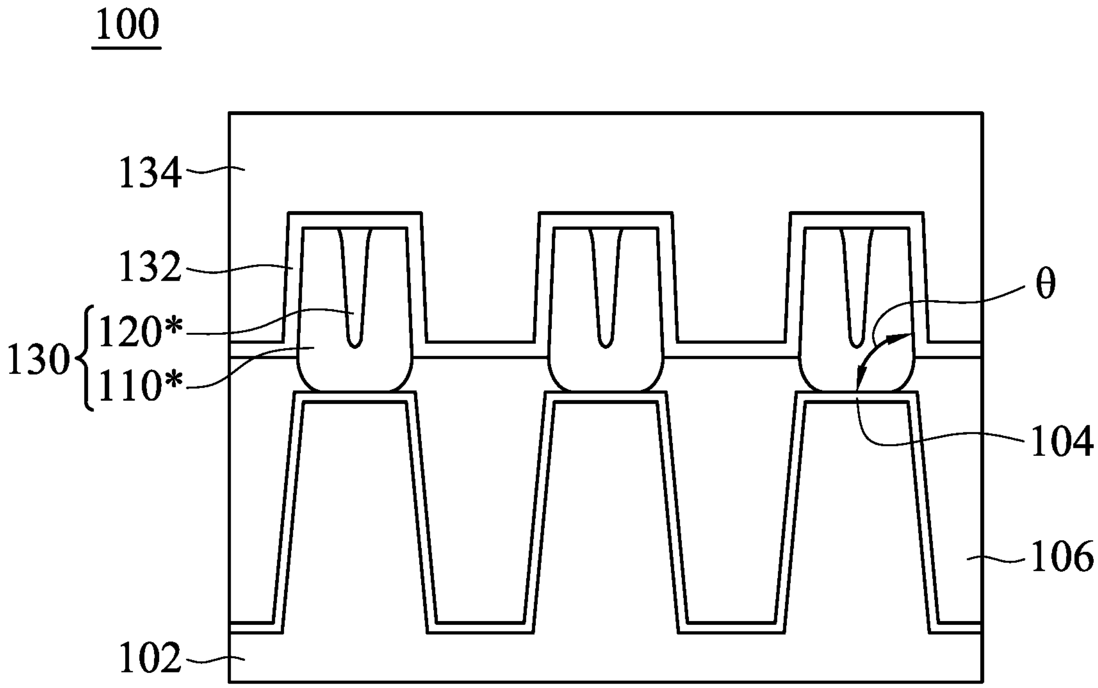

Referring to FIG. 1K, a planarization process (e.g., a CMP process) is performed to level the top surface of the second polysilicon layer 120* with the top surface of the isolation structure 106. Next, an etching-back process is performed to partially remove the isolation structure 106. After the etching-back process, the top surface of the isolation structure 106 is lower than the top surface of the second polysilicon layer 120*. The etching-back process may be a dry etching process, a wet etching process, or a combination thereof. In the present embodiment, the etching-back process is a wet etching process.

Next, the inter-gate dielectric layer 132 is formed conformally on the second polysilicon layer 120* and the isolation structures 106. The material of the inter-gate dielectric layer 132 may include oxide, nitride, oxynitride, other suitable dielectric materials, or a combination thereof. In some embodiments, the inter-gate dielectric layer 132 is a three-layer structure formed by silicon oxide/silicon nitride/silicon oxide. Next, a third polysilicon layer 134 is formed on the inter-gate dielectric layer 132. The third polysilicon layer 134 may be formed by a suitable process, e.g., LPCVD process.

In the present specification, the first polysilicon layer 110* and the second polysilicon layer 120* may be used as the floating gate, and thus the first polysilicon layer 110* and the second polysilicon layer 120* are collectively referred to as the "floating gate 130". Further, the third polysilicon layer 134 may be used as the control gate. In some embodiments, the floating gate 130 and the control gate may each independently include doped polysilicon (e.g., p-type doped polysilicon or n-type doped polysilicon) and thus have better electrical conductivity. In such embodiments, an annealing process may be performed as required to uniformly diffuse the dopant into the floating gate 130 and the control gate.

After forming the control gate, other conventional processes (e.g., patterning the floating gate 130 and the control gate) may be performed to complete the flash memory device 100. Other conventional processes are not described in detail herein.

According to some embodiments of the present disclosure, the method for manufacturing the flash memory device 100 may reduce the seams formed in the floating gate 130. In this way, the performance, yield, reliability and durability of the memory device may be improved.

More specifically, referring to FIG. 1C, after the first deposition process 173, the first recess 115 has a U-shaped cross-sectional profile with the top width less than the bottom width. In the present embodiment, after performing the first cycle twice, the cross-sectional profile of the first recess 115 has become a V-shaped cross-sectional profile with the top width larger than the bottom width. Therefore, the seams formed in the second polysilicon layer 120* may be reduced. In other words, the seams formed in the second polysilicon layer 120* (or the floating gate 130) may be reduced by performing the first cycle several times.

It should be noted that before performing the first in-situ chlorine etching process 175, the first recess 115 is not closed, as shown in FIG. 1C. Therefore, the chlorine etching gas from the first in-situ chlorine etching process 175 may enter the first recess 115 to perform etching. In this way, it is beneficial to forming the first recess 115 with a V-shaped cross-sectional profile, On the other hand, since the opening of the first recess 115 has a suitable dimension, it is possible to avoid too much chlorine entering the first recess 115 and to avoid excessive etching of the first amorphous silicon layer 110 in the bottom region 111B of the first recess 115. In this way, the U-shaped cross-sectional profile of the first recess 115 can be gradually trimmed into an approximate V-shaped cross-sectional profile. Referring to FIGS. 1C and 1E, before the first in-situ chlorine etching process 175, the smallest caliber W3 of the first recess 115 is, for example, 5-10 nm.

Referring to FIGS. 1C to 1F, in each first cycle, the deposition thickness of the first amorphous silicon layer 110 in the bottom region 111B of the first recess 115 is greater than the etching thickness of the first amorphous silicon layer 110 in the bottom region 111B of the first recess 115. Thus, after each first cycle, the aspect ratio of the first recess 115 is gradually reduced and the cross-sectional profile of the first recess 115 is gradually trimmed to approximate a V-shape. In the present embodiment, the first cycle is repeated 2 times. It should be understood that the present embodiment is an example, and is not intended to limit the present disclosure. In order to trim the cross-sectional profile of the first recess 115 to the desired shape, and to improve productivity, the number of repetitions of the first cycle may be controlled to a suitable range. In some embodiments, the first cycle is repeated x times, and x is an integer between 2 and 5.

In the present embodiment, compared to the conventional dry etching process using plasma, the first in-situ chlorine etching process 175 does not use plasma, so that the tunnel oxide layer 104 below the first amorphous silicon layer 110 is not damaged by the plasma. In this way, the yield of the memory device may be further improved. During the first in-situ chlorine etching process 175, the etching rate of the first amorphous silicon layer 110 may be adjusted to a suitable range so that the etching thickness of the first amorphous silicon layer 110 and the cross-sectional profile of the first recess 115 may be well controlled. Furthermore, if the etching rate of the first amorphous silicon layer 110 is controlled in the suitable range, the planarity of the surface of the first amorphous silicon layer 110 and the production efficiency may be improved. The etching rate of the first amorphous silicon layer 110 may be controlled by adjusting the process parameters of the first in-situ chlorine etching process 175. Adjustable process parameters include, but are not limited to, etching time, etching temperature, pressure in the reaction chamber, chlorine gas flow rate, and chlorine gas concentration (i.e., the ratio of chlorine gas flow rate to carrier gas flow rate). In some embodiments, the etching time may be 30-900 seconds. In some embodiments, the etching temperature may be 200-500° C. In some embodiments, the pressure in the reaction chamber may be 50-1000 mTorr. In some embodiments, the chlorine gas flow rate may be 1000-5000 sccm. In some embodiments, the chlorine gas flow rate may be 2-10 times the carrier gas flow rate.

In the present embodiment, after each first in-situ chlorine etching process 175, flow a hydrogen gas through the surface of the first amorphous silicon layer 110, thereby reducing the bump defects formed on the surface of the first amorphous silicon layer 110 and reducing the large dimension seams formed in the first polysilicon layer 110*.

In the present embodiment, the precursors of the cap layer 112 (e.g., disilane or silane) may react with chlorine to avoid remaining chlorine from etching the first amorphous silicon layer 110, thereby improving the surface planarity of the first amorphous silicon layer 110. Further, the precursors of the cap layer 112 may inhibit the movement of silicon atoms with dangling bonds, which may further improve the surface planarity of the first amorphous silicon layer 110. In some embodiments, the cap layer 112 is formed before the first thermal annealing process 179. In this way, the bump defects formed on the surface of the first amorphous silicon layer 110 may be further reduced, and the large dimension seams formed in the first polysilicon layer 110* may be reduced.

In the present embodiment, before performing the first thermal annealing process 179, the first recess 115 is not closed, as shown in FIG. 1G. In other words, the first amorphous silicon layers 110 on opposite sides of the first recess 115 are not connected to each other, and there is a space between the first amorphous silicon layers 110 on the opposite sides of the first recess 115. Thus, the stresses caused by the first thermal annealing process 179 may be released without being accumulated in the first polysilicon layer 110*. In other words, pits may be avoided between the first polysilicon layer 110* and the isolation structures 106, and damage to the tunnel oxide layer 104 during the etching-back process may also be avoided. In this way, the yield and durability of the memory device may be further improved. To effectively release the stress caused by the first thermal annealing process 179, in some embodiments, the smallest caliber W4 of the first recess 115 before the first thermal annealing process 179 is greater than or equal to 5 nm, e.g., 5-10 nm.

Referring to FIG. 1H, the first polysilicon layer 110* at the top surface and the top corner of the isolation structures 106 is thinner than the first polysilicon layer 110* at other locations. In order to avoid the etching solution used in the acid etching process from etching the isolation structures 106, in the present embodiment, after the first thermal annealing process 179, the shortest distance between the top surface of the first polysilicon layer 110* and the top surface of the isolation structures 106 is greater than or equal to 11 nm. In this way, the yield and durability of the memory device may be further improved.

On the other hand, the flash memory device 100 may include a peripheral circuit region (not shown), and the peripheral circuit region may have a substantially planar top surface during the processes of FIGS. 1A to 1H. That is, the first amorphous silicon layer 110 is a uniform layer covering the surface of the peripheral circuit region during the processes of FIGS. 1A to 1H, and the thickness of the first amorphous silicon layer 110 varies with the processes. In order to avoid damage to the tunnel oxide layer 104 on the surface of the peripheral circuit region during the acid etching process, in the present embodiment, after the first thermal annealing process 179, the shortest distance between the top surface of the first polysilicon layer 110* and the top surface of the tunnel oxide layer 104 in the peripheral circuit region is greater than or equal to 11 nm.

Figure 2A:
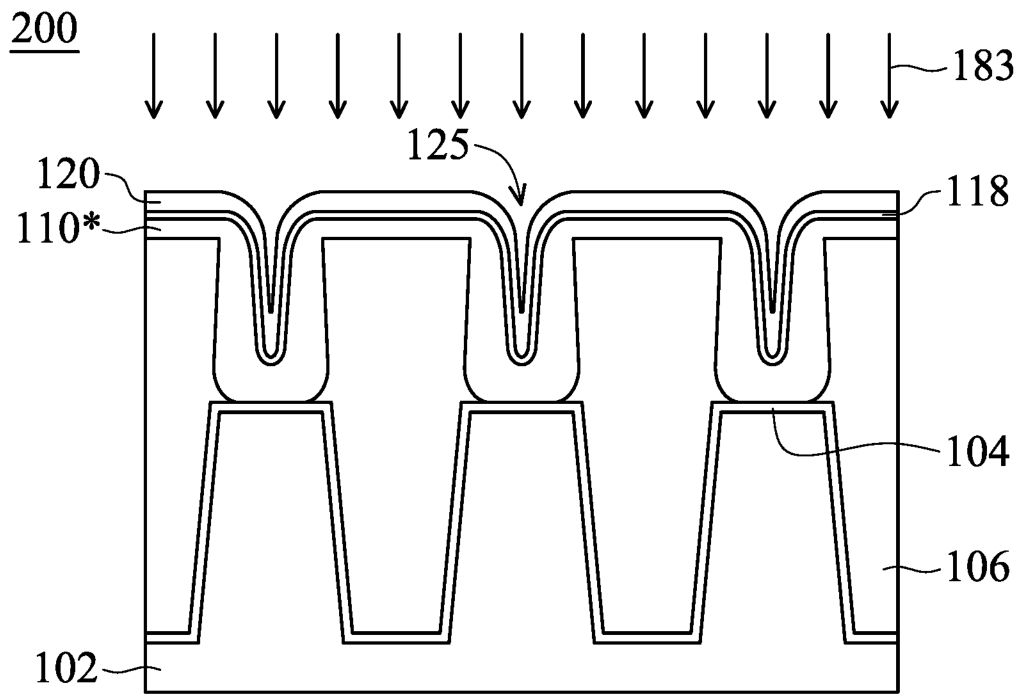
FIGS. 2A and 2B illustrate cross-sectional views at process stages of manufacturing the flash memory device according to other embodiments of the present disclosure.
Figure 2B:
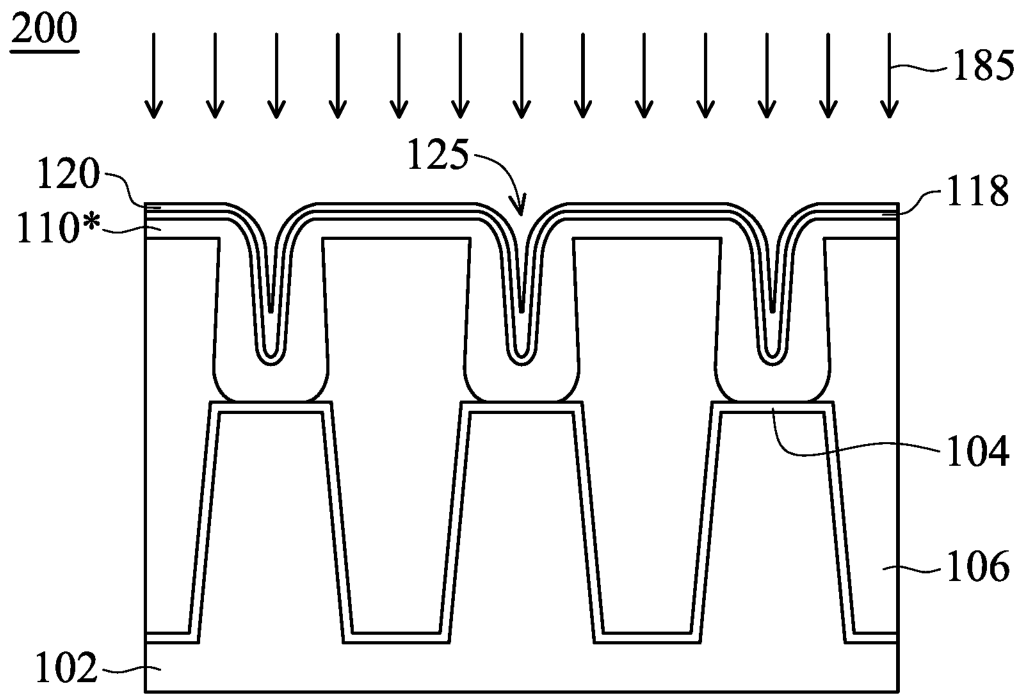

FIGS. 2A and 2B illustrate cross-sectional views at process stages of manufacturing the flash memory device 200 according to other embodiments of the present disclosure. FIGS. 2A and 2B are similar to FIG. 1J. In FIGS. 2A and 2B, the same components as shown in FIG. 1J are denoted by the same symbols. For the sake of simplicity, the components shown in FIG. 1J and their formation steps are not described in detail herein.

Referring to FIGS. 2A and 2B, in the present embodiment, after the acid etching process as described in FIG. 1H and before the amorphous silicon deposition process 193 as described in FIG. 1J, a second cycle is performed at least once. Each second cycle includes a second deposition process 183 and a second in-situ chlorine etching process 185, and more particularly, the processes described in FIGS. 1A to 1H may be performed to form the structure shown in FIG. 1H. Next, after forming the second silicon seed layer 118, a second deposition process 183 is performed to conformally form the second amorphous silicon layer 120 on the first polysilicon layer 110*, as shown in FIG. 2A. The second amorphous silicon layer 120 defines a second recess 125, and after the second deposition process 183, a second in-situ chlorine etching process 185 is performed to widen the caliber of the second recess 125, as shown in FIG. 2B. The second deposition process 183 may be the same as or similar to the first deposition process 173, and the second in-situ chlorine etching process 185 may be the same as or similar to the first in-situ chlorine etching process 175. After performing the second cycle at least once, the flash memory device 200 may be completed by performing the amorphous silicon deposition process 193 as described in FIG. 1J and performing the process as described in FIG. 1K.

As described above, after performing the first thermal annealing process 179, the volume change of the first amorphous silicon layer 110 may cause the first recess 115 defined by the first polysilicon layer 110* to be distorted. In the present embodiment, the cross-sectional profile of the second recess 125 may be trimmed to approximate a V-shape by performing the second cycle. Thus, the seams formed in the second polysilicon layer 120* (or floating gate 130) may be further reduced. In the present embodiment, the second cycle is repeated one more time. It should be understood that the present embodiment is an example, and is not intended to limit the present disclosure. In order to trim the cross-sectional profile of the second recess 125 to the desired shape, and to improve productivity, the number of repetitions of the second cycle may be controlled to a suitable range. In some embodiments, the second cycle is repeated y times, and y is an integer between 1 and 3. It should be noted that the dimension of the first recess 115 as defined by the first polysilicon layer 110* is greater than the dimension of the second recess 125 as defined by the second amorphous silicon layer 120. Therefore, compared to the second cycle, the process of the first cycle is easier to control well. The number of repetitions of the first cycle and the second cycle may be adjusted separately, which will facilitate better control of the process of the second cycle and effectively reduce the seams. In some embodiments, the first cycle is repeated x times and the second cycle is repeated y times, and x is greater than or equal to y.

The process condition of the second cycle may be the same as or similar to the process condition of the first cycle. For example, in some embodiments, the second recess 125 has a caliber that, at its smallest, is 5-10 nm before each second in-situ chlorine etching process 185. This facilitates the formation of the second recess 125 with a V-shaped cross-sectional profile. After the second in-situ chlorine etching process 185, a hydrogen gas is introduced to flow through the surface of the second amorphous silicon layer 120, where a flow rate of the hydrogen gas is 300-6000 sccm. In this way, bump defects formed on the surface of the second amorphous silicon layer 120 are reduced and the seams formed in the second polysilicon layer 120* are reduced.

A flash memory device 100 is provided in some embodiments of the present disclosure. Referring to FIG. 1K, the flash memory device 100 includes a substrate 102, a tunnel oxide layer 104, a plurality of isolation structures 106, a floating gate 130, an inter-gate dielectric layer 132, and a control gate (a third polysilicon layer 134). The isolation structures 106 are formed in the substrate 102 and the tunnel oxide layer 104 is between the floating gate 130 and the substrate 102. The floating gate 130 is formed between two adjacent isolation structures 106 and has a cross-sectional profile with the top width less than the bottom width. The floating gate 130 includes a first polysilicon layer 110* and a second polysilicon layer 120*. The first polysilicon layer 110* is formed on the tunnel oxide layer 104 and is between two adjacent isolation structures 106. The second polysilicon layer 120* is formed on the first polysilicon layer 110*. The inter-gate dielectric layer 132 is formed on the floating gate 130. The control gate is formed on the inter-gate dielectric layer 132. It should be noted that the first polysilicon layer 110* and the second polysilicon layer 120* are formed separately in different thermal annealing processes. Therefore, the first polysilicon layer 110* and the second polysilicon layer 120* have an interface with a V-shaped cross-sectional profile, as shown in FIG. 1K.

In the present embodiment, the cross-sectional profile of the first recess 115 may be trimmed to approximate a V-shape by performing the first cycle at least once. Further, the stress between the amorphous silicon layer 110 and the isolation structures 106 are released by a thermal annealing process before the first recess 115 is completely filled. As a result, a V-shaped interface is formed between the first polysilicon layer 110* and the second polysilicon layer 120*. In this way, the seams formed in the floating gate 130 may be reduced, thereby improving the performance, yield, reliability and durability of the memory device.

Referring to both FIGS. 1A and 1K, in the present embodiment, by performing the first cycle at least once, even if the opening 105 has a profile with the top width less than the bottom width, it is still possible to form a floating gate 130 with few or no seams. In other words, in the present embodiment, it is possible to improve the performance, yield, reliability and durability of the memory device without trimming the top of the isolation structure 106. Referring to FIG. 1K, the angle θ between the extension line of the sidewall of the floating gate 130 and the top surface of the substrate 102 is 80.0-88.5 degrees.

It should be noted that after each first in-situ chlorine etching process 175, a portion of the chlorine atoms may bond with the silicon atoms with dangling bonds and form a chlorine-containing layer on the surface of the first recess 115. In this way, in the present embodiment, a chlorine-containing layer is formed in the first polysilicon layer 110*. In addition, in the embodiment shown in FIGS. 2A and 2B, the second cycle is performed at least once. Similarly, after each second in-situ chlorine etching process 185, a chlorine-containing layer is formed on the surface of the second recess 125. Thus, in such embodiments, a chlorine-containing layer is formed in the second polysilicon layer 120* and the chlorine-containing layer has a V-shaped cross-sectional profile. In some embodiments, the chlorine-containing layer is in the first polysilicon layer 110* and the chlorine concentration in the chlorine-containing layer is $10^{15}$-$10^{17}$ atoms/$cm^3$. In some embodiments, the chlorine-containing layer is present in the first polysilicon layer 110* and in the second polysilicon layer 120*, and the chlorine concentration in each chlorine-containing layer is independently $10^{15}$-$10^{17}$ atoms/$cm^3$.

In order to demonstrate the effect of the first cycle (and/or the second cycle) including the in-situ chlorine etching process on the number of seams, an experiment was carried out.

The test structure of Example 1 was manufactured in accordance to the related steps illustrated in FIGS. 1A to 1J described above. In Example 1, the first cycle was performed 3 times. The test structure of Example 2 was manufactured in accordance to the related steps described in FIGS. 1A to 1J and FIGS. 2A to 2B described above. In Example 2, the first cycle was performed 2 times and the second cycle was performed 1 time. The test structure of Comparative Example 1 was manufactured according to the prior art (Patent No. TWI463551). In more detail, the test structure of Comparative Example 1 was manufactured in accordance to the related steps described in the specification and FIGS. 3A to 3G of TWI463551. The test structure of Comparative Example 2 was manufactured by the following method. The structure as shown in FIG. 1A was formed following the steps described in FIG. 1A described above. Afterwards, an amorphous silicon layer was directly deposited in the opening 105 to fill the opening 105. Next, the amorphous silicon layer was transformed into a polysilicon layer by the same thermal annealing process as the first thermal annealing process 179. In other words, in Comparative Example 1 and Comparative Example 2, the in-situ chlorine etching process was not performed at all.

The first CMP process was performed on the test structure of Example 1. When the thickness of the polysilicon layer reached 90 nm, the first CMP process was stopped. The number of seams was calculated for the test structure of Example 1. Next, a second CMP process was performed on the test structure of Example 1. When the thickness of the polysilicon layer reached 50 nm, the second CMP process was stopped. The number of seams was calculated for the test structure of Example 1.

The test structure of Example 2, the test structure of Comparative Example 1 and the test structure of Comparative Example 2 were tested separately to calculate the number of seams in the polysilicon layer. The fewer the seams, the better the quality of the polysilicon layer. The results are shown in Table 1 below.

TABLE 1

| | | Example 1 | Example 2 | Comparative Example 1 | Comparative Example 2 |
|---|---|---|---|---|---|
| First CMP | Large seams (pcs) | 0 | 0 | 0 | cannot be calculated |
| | Small seams (pcs) | 337 | 32 | 343 | cannot be calculated |
| Second CMP | Large seams (pcs) | 0 | 0 | 0 | cannot be calculated |
| | Small seams (pcs) | 3490 | 340 | 8070 | cannot be calculated |

In Table 1, the experimental result markers for Comparative Example 2 cannot be calculated. This means that the density of seams in the test structure of Comparative Example 2 was too high (or the number of defects exceeded the machine's limit for keeping data per sheet and there were still defects that had not been scanned). In Comparative Example 2, the recess used to form the floating gate were not trimmed, and no in-situ chlorine etching process was performed. As shown in Table 1, the test structure of Comparative Example 2 had a very large number of seams. In Comparative Example 1, the recess used in forming the floating gate were widened, but no in-situ chlorine etching process was performed either. As shown in Table 1, the test structure of Comparative Example 1 had fewer seams.

In contrast, the first cycle (i.e., at least one in-situ chlorine etching process) was performed at least once in both of Example 1 and Example 2. As shown in Table 1, when the thickness of the polysilicon layer was 90 nm, the number of seams in Example 2 was about 9% of the number of seams in Example 1. As shown in Table 1, when the thickness of the polysilicon layer was 50 nm, the number of seams in Example 1 was approximately 43% of the number of seams in Comparative Example 1, and the number of seams in Example 2 was approximately 4.3% of the number of seams in Comparative Example 1.

The above experimental results demonstrate that the first cycle and the second cycle of the in-situ chlorine etching process may significantly reduce the number of seams in the floating gate polysilicon layer. Therefore, the present embodiment may improve the yield and durability of the memory device.

Furthermore, in order to demonstrate the effect of the hydrogen gas on the number of bump defects, an experiment was carried out.

The test structure of Example 3 was manufactured in accordance to the related steps illustrated in FIGS. 1A to 1J described above. In Example 3, a first cycle was performed 3 times and a hydrogen gas with a flow rate of 1500 sccm was introduced after each first in-situ chlorine etching process 175. The test structure of Comparative Example 3 was manufactured in accordance to the related steps illustrated in FIGS. 1A to 1J described above. However, in Comparative Example 3, the hydrogen gas is not introduced after each first in-situ chlorine etching process 175.

The experimental results demonstrate that in the test structure of Comparative Example 3, a plurality of bump defects were formed, and the dimensions of some of these bump defects were equal to or greater than the caliber of the first recess 115. In contrast, in the test structure of Example 3, almost no bump defects were formed. From the above experimental results, it can be demonstrated that the introduction of the hydrogen gas after each in-situ chlorine etching process may reduce the bump defects.

Furthermore, in order to prove the existence of the chlorine-containing layer, secondary ion mass spectroscopy (SIMS) was performed on the test structure of Example 2. The presence of chlorine in the polysilicon layer was confirmed, and the chlorine concentration was about $2\times10^{16}$ atoms/$cm^3$.

According to the method for manufacturing a flash memory device provided in the embodiment of the present disclosure, the shape of the amorphous silicon layer may be gradually trimmed by performing the first cycle and/or the second cycle. Thus, the number of seams may be reduced even if the recess used in forming the floating gate are not trimmed. Furthermore, the stress between the amorphous silicon layer and the isolation structure is released by the thermal annealing process before the recess is completely filled to avoid the formation of pits between the polysilicon layer and the isolation structure. In this way, the performance, yield, reliability and durability of the memory device may be improved. In addition, all processes of the first and second cycle can be performed in the same machine and can be integrated into the existing flash memory device process without modifying or replacing the process and/or production equipment, with minimal impact on production cost.

The present invention is suitable for making miniaturized flash memory, so as to increase the total number of dies on a wafer. Therefore, the production cost and energy consumption of manufacturing a single IC are reduced, and the production energy consumption of subsequent packaging is also reduced, thereby reducing carbon emissions in the process of producing flash memory. Besides, since reliability and durability of the flash memory device of the present invention are improved, the present invention provides a sustainable flash memory device.

Furthermore, the flash memory devices of the present disclosure may be used on automotive electronics, such as Advanced Driver Assistance Systems (ADAS), Instrument Clusters, Infotainment. The flash memory devices of the present disclosure may be used on space constrained applications including Wearable, MP3 players, smart watches, games, digital radio, toys, cameras, digital photo album, GPS, Bluetooth and WiFi modules. The flash memory devices of the present disclosure may be used on IoT and mobile electronic devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a flash memory device, comprising:

forming a plurality of isolation structures in a substrate, wherein an opening is formed between adjacent two of the isolation structures, wherein a top width of the opening is less than a bottom width of the opening;

conformally depositing a first silicon seed layer on the substrate and the isolation structures;

performing a first cycle, wherein the first cycle comprises:

performing a first deposition process to conformally form a first amorphous silicon layer on the first silicon seed layer, wherein a first recess is defined by the first amorphous silicon layer; and after the first deposition process, performing a first in-situ chlorine etching process to widen a caliber of the first recess;

performing a first thermal annealing process to transform the first amorphous silicon layer into a first polysilicon layer; and performing an amorphous silicon deposition process to form an amorphous silicon layer on the first polysilicon layer and to completely fill the opening.

2. The method as claimed in claim 1, further comprising:

before the first thermal annealing process, conformally forming a cap layer on the first amorphous silicon layer, wherein during the first thermal annealing process, the cap layer and the first amorphous silicon layer are transformed into the first polysilicon layer, and wherein after the first thermal annealing process, a shortest distance between a top surface of the first amorphous silicon layer and a top surface of the isolation structures is greater than or equal to 11 nm.

3. The method as claimed in claim 1, further comprising:

after performing the first thermal annealing process and before performing the amorphous silicon deposition process, performing an acid etching process;

after the acid etching process, conformally depositing a second silicon seed layer on the first polysilicon layer;

after the amorphous silicon layer completely filling the opening, performing a second thermal annealing process to transform the amorphous silicon layer into a second polysilicon layer; and performing a planarization process to level a top surface of the second polysilicon layer with a top surface of the isolation structures.

4. The method as claimed in claim 1, wherein before the first thermal annealing process, a smallest caliber of the first recess is greater than or equal to 5 nm.

5. The method as claimed in claim 1, wherein before each of the first in-situ chlorine etching process, a smallest caliber of the first recess is 5-10 nm.

6. The method as claimed in claim 1, wherein after each of the first in-situ chlorine etching process, flowing a hydrogen gas over a surface of the first amorphous silicon layer.

7. The method as claimed in claim 1, wherein during each of the first in-situ chlorine etching process, an etching amount of the first amorphous silicon layer at a top of the first recess is greater than an etching amount of the first amorphous silicon layer at a bottom of the first recess.

8. The method as claimed in claim 1, wherein during each of the first cycle, a deposition thickness of the first amorphous silicon layer at a bottom of the first recess is greater than an etching thickness of the first amorphous silicon layer at the bottom of the first recess.

9. The method as claimed in claim 1, further comprising:

before performing the amorphous silicon deposition process, performing a second cycle, wherein the second cycle comprises:

performing a second deposition process to conformally form a second amorphous silicon layer on the first polysilicon layer, wherein a second recess is defined by the second amorphous silicon layer; and after the second deposition process, performing a second in-situ chlorine etching process to widen a caliber of the second recess.

10. The method as claimed in claim 9, wherein the first cycle is repeated x times and the second cycle is repeated y times, wherein y is less than or equal to x.

11. The method as claimed in claim 9, further comprising:

after performing the first thermal annealing process and before performing the amorphous silicon deposition process, performing an acid etching process;

after the acid etching process, conformally depositing a second silicon seed layer on the first polysilicon layer;

after the amorphous silicon layer completely filling the opening, performing a second thermal annealing process to transform the second amorphous silicon layer and the amorphous silicon layer into a second polysilicon layer; and performing a planarization process to level a top surface of the second polysilicon layer with a top surface of the isolation structures.

12. The method as claimed in claim 9, wherein before each of the second in-situ chlorine etching process, a smallest caliber of the second recess is 5-10 nm.

13. The method as claimed in claim 9, wherein after each of the second in-situ chlorine etching process, flowing a hydrogen gas over a surface of the second amorphous silicon layer.

14. The method as claimed in claim 1, wherein the first cycle is repeated x times, and wherein x is an integer between 2 and 5.

15. The method as claimed in claim 1, wherein a temperature of the first thermal annealing process is between 700° C. and 1000° C.

* * * * *